(12) United States Patent
Fiolka et al.

(10) Patent No.: US 8,081,293 B2
(45) Date of Patent: Dec. 20, 2011

(54) ILLUMINATION SYSTEM OF A MICROLITHOGRAPHIC PROJECTION EXPOSURE APPARATUS

(75) Inventors: Damian Fiolka, Oberkochen (DE); Nils Dieckmann, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 559 days.

(21) Appl. No.: 12/191,069

(22) Filed: Aug. 13, 2008

(65) Prior Publication Data

US 2009/0027646 A1  Jan. 29, 2009

Related U.S. Application Data

(63) Continuation of application No. PCT/EP2007/051179, filed on Feb. 7, 2007.

(60) Provisional application No. 60/775,101, filed on Feb. 21, 2006.

(30) Foreign Application Priority Data

Feb. 21, 2006 (DE) .......................... 10 2006 008 357
Jun. 21, 2006 (DE) .......................... 10 2006 028 489

(51) Int. Cl.
*G03B 27/54* (2006.01)
(52) U.S. Cl. ......................................... 355/67
(58) Field of Classification Search .................... 355/53, 355/67, 71; 359/483, 499
See application file for complete search history.

(56) References Cited

U.S. PATENT DOCUMENTS

| 2002/0027719 A1* | 3/2002 | Kreuzer ................... 359/631 |
| 2003/0128349 A1* | 7/2003 | Unno .......................... 355/67 |
| 2003/0168597 A1 | 9/2003 | Webb et al. |
| 2004/0150877 A1 | 8/2004 | Hogele et al. |
| 2005/0146798 A1* | 7/2005 | Kraehmer et al. ......... 359/650 |

FOREIGN PATENT DOCUMENTS

| DE | 103 02 765 | 7/2004 |
| WO | WO 03/040785 | 5/2003 |
| WO | WO 2005/054954 | 6/2005 |
| WO | WO 2005/069081 | 7/2005 |

OTHER PUBLICATIONS

Translation of the International Preliminary Report on Patentability, for the corresponding PCT Application No. PCT/EP2007/051179, dated Oct. 23, 2008.

* cited by examiner

*Primary Examiner* — Hung Henry Nguyen
*Assistant Examiner* — Steven H Whitesell Gordon
(74) *Attorney, Agent, or Firm* — Fish & Richardson P.C.

(57) ABSTRACT

The disclosure provides an illumination system of a microlithographic projection exposure apparatus, as well as related methods and components. In some embodiments, the illumination system includes an optical element configured so that, when a linearly polarized entry beam which has an angle spectrum is incident on the first optical element, a maximum aperture angle of the entry beam at the first optical element is not more than 35 mrad. A component, which is rotationally symmetric about an optical axis of the system, of a birefringence present in the illumination system can be at least partially compensated by the first optical element.

20 Claims, 8 Drawing Sheets

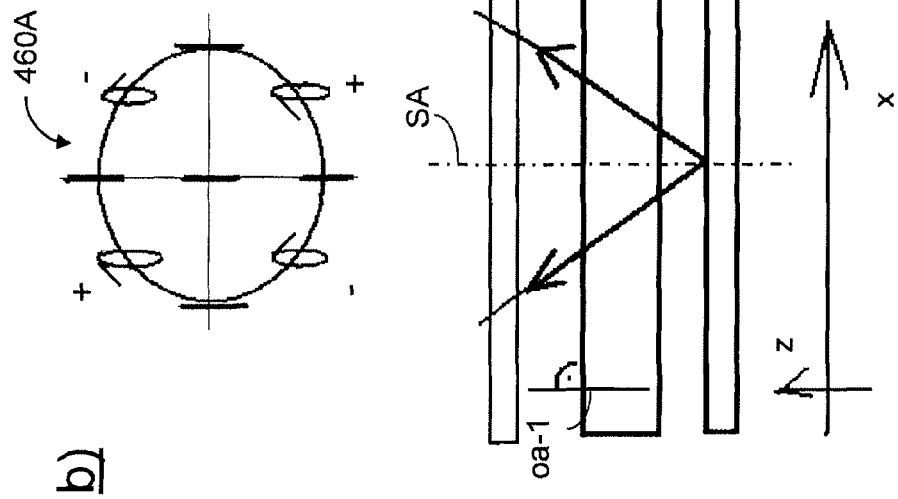
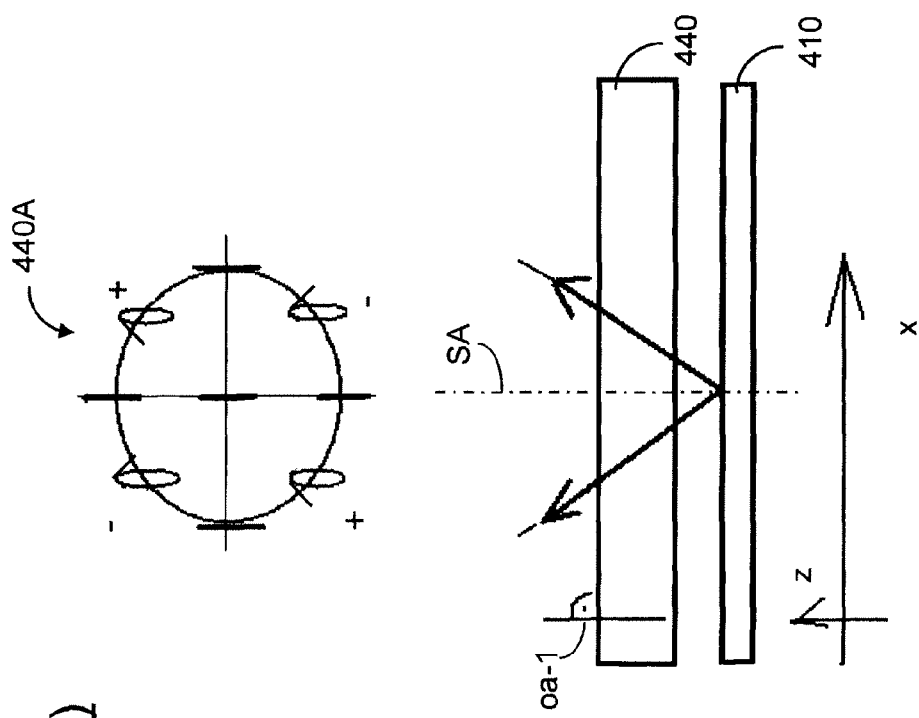
Fig. 4

ILLUMINATION SYSTEM OF A MICROLITHOGRAPHIC PROJECTION EXPOSURE APPARATUS

CROSS-REFERENCE TO RELATED APPLICATIONS

This application is a continuation of international application serial number PCT/EP2007/051179, filed Feb. 7, 2007, which claims benefit of U.S. Ser. No. 60/775,101, filed Feb. 21, 2006, German patent application serial number 10 2006 008 357.1, filed Feb. 21, 2006, and German patent application serial number 10 2006 028 489.5, filed Jun. 21, 2006. The full disclosure of international patent application serial number PCT/EP2007/051179 is incorporated herein by reference.

FIELD

The disclosure relates to an illumination system of a microlithographic projection exposure apparatus, as well as related methods and components.

BACKGROUND

Microlithography can be used for the production of microstructured components such as for example integrated circuits or LCDs. The microlithography process is typically carried out in what is referred to as a projection exposure apparatus having an illumination system and a projection objective. The image of a mask (commonly referred to as a reticle) illuminated via the illumination system is projected via the projection objective on to a substrate (for example a silicon wafer) which is coated with a light-sensitive layer (for example photoresist) and arranged in the image plane of the projection objective in order to transfer the mask structure on to the light-sensitive coating on the substrate.

SUMMARY

In some embodiments, the disclosure provides an illumination system of a microlithographic projection exposure apparatus, which permits improved polarisation acquisition.

In certain embodiments, the disclosure provides an illumination system. The illumination system includes at least one optical element configured so that, when a linearly polarised entry beam which has an angle spectrum is incident on the optical element, a maximum aperture angle of the entry beam at the location of the optical element is not more than 35 mrad. A component of a birefringence present in the illumination system can be at least partially compensated by the optical element. The component of the birefringence is rotationally symmetric about the optical axis of the illumination system.

In that respect in the context of the present application the term "linearly polarised entry beam" is used to denote an entry beam with a linear polarisation distribution of constant preferred polarisation direction (that is to say in particular not a polarisation distribution with a locally varying preferred polarisation direction, that is to say for example not a radial or tangential polarisation distribution).

In some embodiments, the optical element includes optically uniaxial crystal material which is not optically active, with an optical crystal axis, wherein the optical crystal axis is oriented in parallel relationship with the optical axis of the illumination system.

As a consequence of the use of the optical element of optically uniaxial crystal material which is not optically active, having an optical crystal axis which is oriented in parallel relationship with the optical axis of the illumination system, a rotationally symmetric structure which is thus suitable for the compensation of rotationally symmetric interference components can be afforded by virtue of the geometry of the crystal structure or the birefringence caused thereby in the optical element, as the refractive index ellipsoid in the optically uniaxial crystal material is rotationally symmetric around the optical crystal axis (and thus also around the optical axis, parallel thereto, of the illumination system).

By virtue of the fact that a linearly polarised entry beam having an angle spectrum is incident on the optical element, the rays of that entry beam pass through the element at different angles in relation to the refractive index ellipsoid in the optically uniaxial crystal material. In any non-perpendicular transiting of the optical element the electrical field strength vector has both a component which is parallel to the optical crystal axis and also a component which is perpendicular thereto, where the two components experience a different refractive index in the optical element and the strength of the birefringence caused thereby increases quadratically with the angle relative to the optical crystal axis in a first approximation (that is to say for small angles), and therefore becomes correspondingly greater, the more inclinedly that the beam passes through the optical element.

Accordingly, in the optical element, the rotational symmetry of birefringence, caused by the rotationally symmetric property of the refractive index ellipsoid, can be advantageously combined with the approximately quadratic increase in the strength of the birefringence with the respective angle of the ray relative to the optical crystal axis. Accordingly, with a suitable choice in respect of the sign of that birefringence, it is possible to achieve effective compensation of the rotationally symmetric interference components which are present in the illumination system without the optical element.

In some embodiments, a maximum aperture angle of the entry beam at the location of the optical element is not more than 35 mrad (e.g., not more than 30 mrad, not more than 25 mrad). Consequently the maximum aperture angles which occur in the entry beam incident on the optical element can be sufficiently small so that the correction action of the optical element (which increases approximately quadratically with that aperture angle) can also limited. The optical element can therefore still be produced with adequate mechanical stability or a minimum thickness which is to be appropriately managed from the point of view of production engineering.

In certain embodiments, the optical element is of a thickness in the range of between 0.25 mm and 5 mm (e.g., in the range of between 0.5 mm and 3 mm).

In some embodiments, the optical element is arranged immediately after a first field plane (as viewed from the light source or in the light propagation direction) of the illumination system. The optical element can thus be arranged immediately after a plane in which an angle distribution is produced. At such a position this can help to ensure that the maximum aperture angles occurring in the entry beam incident on the optical element are sufficiently small.

In some embodiments, the illumination system has a diffractive optical element, wherein the optical element is arranged immediately after the diffractive optical element in the light propagation direction. In certain embodiments, the entry beam is a divergent light beam.

In accordance with the disclosure the term "optical element" includes two or more sub-elements which are combined together to form a common element or an arrangement, wherein those sub-elements can then be both separate from each other and also joined to each other (for example wrung together), in which respect it is also possible in that way in particular to form an arrangement involving overall substantially plane-parallel geometry.

Although the optical element, as already stated, can be made from optically uniaxial crystal material which is not optically active, alternatively it can basically also include two (or also more) sub-elements or lenses of intrinsically birefringent material which are rotated relative to each other about the optical axis of the system (referred to as "lens clocking"). For example a resultant, rotationally symmetric birefringence distribution can also be achieved via rotation of two lenses present in the (100)-crystal cut of intrinsically birefringent crystal material relative to each other through an angle of 45° ("clocking angle") about the lens axis or about the optical axis of the system in per se known manner. In that case the lens materials used in that respect of intrinsically birefringent material can have a high refractive index (that is to say a refractive index which at the working wavelength used is substantially higher than the refractive index of quartz).

In certain embodiments, the optical element involves a substantially plane-parallel geometry.

In some embodiments, the optical element is formed from two wedge-shaped sub-elements which are displaceable relative to each other in a direction perpendicular to the optical axis of the illumination system. In that way it is possible to achieve continuous adjustability of the strength of the birefringence correction effect by displacement of those sub-elements relative to each other.

In certain embodiments, one of the two sub-elements is made from positively uniaxial crystal material and the other of those two sub-elements is made from negatively uniaxial crystal material. Thus, by displacement of the wedges and possibly additional suitable limitation of the optically effective region, it is possible to respectively select a suitable, optically effective region of the wedge arrangement in flexible fashion, in which (depending on the respective birefringence distribution to be compensated) the positive or the negative optically uniaxial material dominates so that, depending on the respective requirements involved, a tangential or a radial birefringence distribution can be compensated in the illumination system. In the sense of the present application the term tangential birefringence distribution is used to denote such a distribution in which the fast axis of the birefringence is oriented in perpendicular relationship to the radius directed on to the optical axis of the system. In a corresponding fashion the term radial birefringence distribution is used to denote such a distribution in which the fast axis of the birefringence is oriented in parallel relationship with the radius directed on to the optical axis of the system. In that respect the term "fast axis" is used to denote that axis in the birefringent medium having the maximum propagation speed, that is to say the minimum refractive index.

In some embodiments, the optically uniaxial crystal material is selected from magnesium fluoride ($MgF_2$), sapphire ($Al_2O_3$), lithium fluoride ($LiF_2$) and calc-spar ($CaCO_3$).

In certain embodiments, a lambda/2-plate is arranged immediately after the optical element in the light propagation direction. By the additional inclusion of a lambda/2-plate, in order to compensate for a predetermined, rotationally symmetric birefringence distribution, it is possible to use an optically uniaxial material of opposite sign (that is to say instead of positively uniaxial material, negatively uniaxial material, or vice-versa), which is advantageous depending on the respective availability of those materials as there is then no reliance on a given optically uniaxial material. In that case the lambda/2-plate can be of zero order or also (for example to implement greater thicknesses) of higher order.

In some embodiments, there is provided at least one manipulator by which a predetermined tilt angle between the optical crystal axis and the optical axis of the illumination system can be set. In that respect the tilt angle which is adjusted by the at least one manipulator can be regulatable in dependence on an illumination mode of the illumination system and/or the direction of a light beam which is introduced by a light source of the illumination system.

In certain embodiments, the disclosure provides an illumination system that has a first optical element in which a birefringence distribution which is radial in relation to the optical axis is produced, and a second optical element in which a birefringence distribution which is tangential in relation to the optical axis is produced, wherein an effective birefringence distribution is produced by superpositioning of the radial birefringence distribution produced in the first optical element and the tangential birefringence distribution produced in the second optical element, which effective birefringence distribution at least partially compensates a component, which is rotationally symmetric about the optical axis, of a birefringence which is present elsewhere in the illumination system.

That approach is based on the fact that, by applying pressure or tension to an initially non-birefringent element (for example of quartz glass), a birefringence distribution can be produced as a consequence of stress birefringence. In that respect however controlled quantitative adjustment of a tangential birefringence distribution produced by way of a tensile force can be more difficult than the radial birefringence distribution which can be produced in a more controlled fashion by the application of a pressure force. If the tangential birefringence distribution exceeds the radial amount, the combination of both distributions in a first and a second optical element makes it possible as the outcome to produce a tangential birefringence distribution, but with an adjustable "offset". Consequently the radial birefringence distribution which can be produced in a controlled fashion in the first optical element can be used for fine adjustment of the magnitude of the effective birefringence distribution ultimately produced by superpositioning of the two birefringence distributions so that the problem of direct production of a tangential birefringence distribution which is defined in respect of amount of circumvented.

In some embodiments, a manipulator device is provided to alter the radial birefringence distribution in the first optical element. The manipulator device can be adapted in particular for acting on the first optical element with a force directed radially towards the optical axis (for example in the form of a plurality of piezoactuators).

In certain embodiments, the tangential birefringence distribution produced in the second optical element can be produced by acting on the second optical element with a force directed outwardly radially with respect to the optical axis (that is to say a tensile force). The radially outwardly directed force can be produced in particular by adhesive shrinkage of an adhesive between the second optical element and an outer ring.

In some embodiments, the first and/or the second optical element are arranged at least in the proximity of a pupil plane of the illumination system.

The disclosure also relates to a microlithographic projection exposure apparatus.

The disclosure further relates to a process for the microlithographic production of microstructured components and a microstructured component.

Further configurations of the disclosure are set forth in the description and the claims. The disclosure is described in greater detail hereinafter by embodiments by way of example illustrated in the accompanying drawings.

BRIEF DESCRIPTION OF THE DRAWINGS

In the drawings:

FIGS. 4a-4b shows diagrammatic views to describe a a portion of an illumination system;

DETAILED DESCRIPTION

Figure 5:
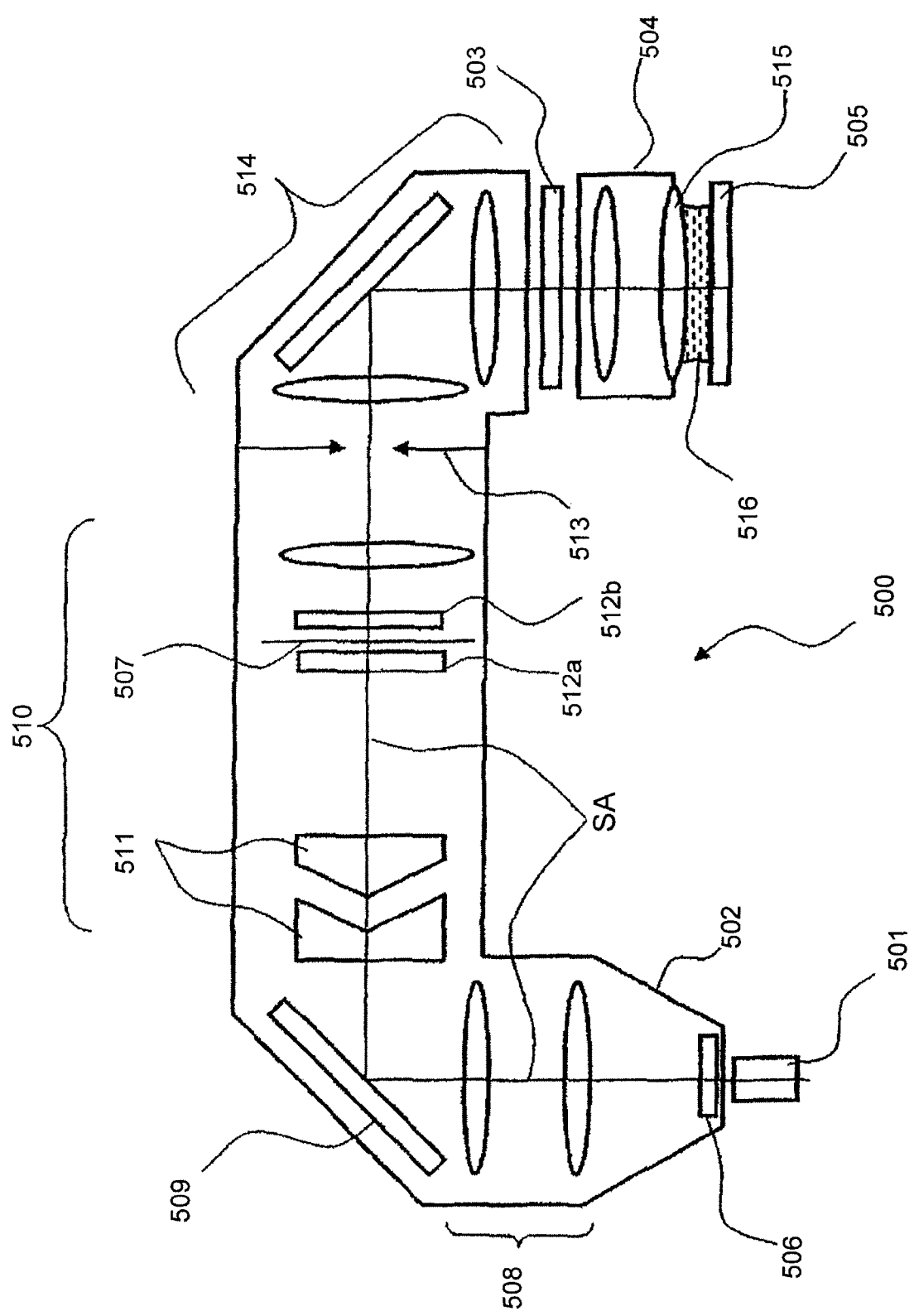
FIG. 5 shows a diagrammatic view of the structure in principle of a microlithographic projection exposure apparatus.

Reference is firstly made to FIG. 5 hereinafter as a simplified diagrammatic view to describe the structure in principle of a microlithographic projection exposure apparatus.

The microlithographic projection exposure apparatus 500 has a light source unit 501, an illumination system 502, a structure-bearing mask 503, a projection objective 504 and a substrate 505 to be exposed. The light source unit 501 as the light source may include for example an ArF laser for a working wavelength of 193 nm as well as a beam-forming optical system which produces a parallel light beam. A parallel light beam emitted by the light source unit 501 is firstly incident on a diffractive optical element (DOE) 506. The DOE 506 produces a desired intensity distribution, for example a dipole or quadrupole distribution, in a pupil plane 507, by way of an angle emission characteristic defined by the respective diffractive surface structure. An objective 508 which follows the DOE 506 in the beam path is in the form of a zoom objective which produces a parallel light beam of variable diameter. The parallel light beam is directed by a deflection mirror 509 on to an optical unit 510 having an axicon 511. Different illumination configurations are generated by the zoom objective 508 in conjunction with the upstream-disposed DOE 506 and the axicon 511 in the pupil plane 507 depending on the respective zoom position and the position of the axicon elements. After the axicon 511 the optical unit 510 includes a light mixer system which is arranged in the region of the pupil plane 507 and which for example can have an arrangement of microoptical elements 512a, 512b, which is suitable for producing a light mixing effect. The optical unit 510 is followed by a reticle masking system (REMA) 513, the image of which is formed by an REMA objective 514 on the reticle 503 and thereby defines the illuminated region on the reticle 503. The reticle 503 is projected with the projection objective 504 on to the light-sensitive substrate 505. In the illustrated embodiment disposed between a last optical element 515 of the projection objective 504 and the light-sensitive substrate 505 is an immersion fluid 516 with a refractive index different from air.

Figure 9:
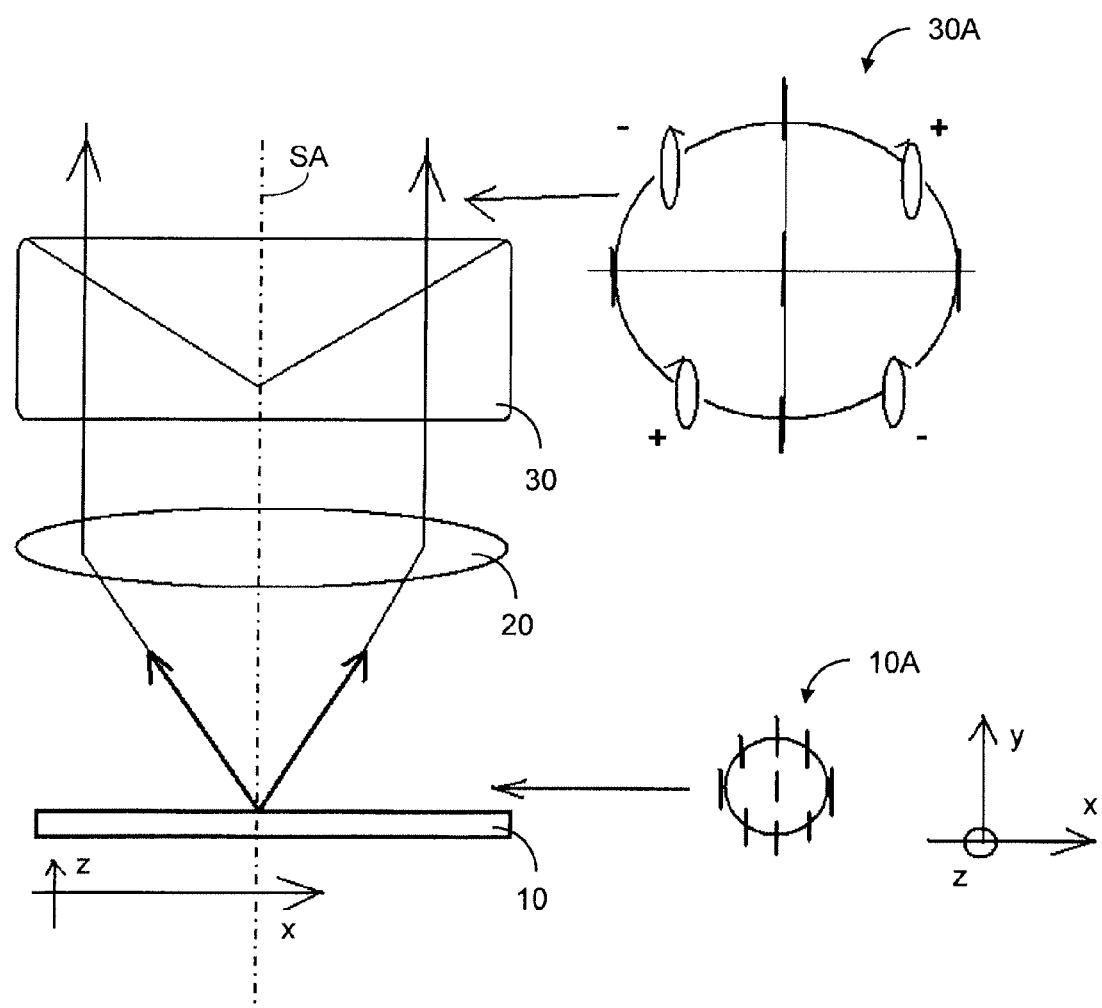
FIG. 9 shows a simplified view of a portion of an illumination system of a microlithographic projection exposure apparatus.

FIG. 9 in a further simplified portion shows downstream of the diffractive optical element (DOE) 10 at the entry into the illumination system only a lens 20 and the axicon 30, wherein the DOE 10 is irradiated with light which is linearly polarised in the y-direction (which here corresponds to the scanning direction of the microlithographic projection exposure apparatus).

On the assumption that the lens 20 and the axicon 30 involve a radial birefringence distribution, the magnitude of which increases towards the edge of the pupil, the polarisation distribution which is still linear downstream of the DOE 10 (identified as 10A) results in the polarisation distribution over the pupil, which is identified by 30A downstream of the axicon 30. The polarisation states on the x- and the y-axis are not influenced by the radial birefringence distribution of the lens 20 and the axicon 30 as that involves inherent states in relation to the radial birefringence distribution, that is to say here the orientation of the linear polarisation is in perpendicular relationship to the fast axis of that radial birefringence distribution. In the other positions which are azimuthally displaced in relation to the x- and y-axis respectively, elliptically polarised light occurs in the pupil as a consequence of the radial birefringence distribution of the lens 20 and the axicon 30, more specifically right or left elliptically polarised light, depending on the respective segment.

In the example shown in FIG. 9 the light in the pupil is right elliptically polarised in the first and third segments (that is to say the regions of the azimuth angle between 0° and 90° and between 180° and 270°) (identified by "+" in FIG. 9) whereas the light in the pupil is left elliptically polarised in the second and fourth segments (that is to say the regions of the azimuth angle between 90° and 180° and between 270° and 360°) (identified by "−" in FIG. 9). The respective circulation direction of the elliptical polarisation is further specified in FIG. 9 and in other corresponding illustrations in the present application by the lines (or "half-arrows" at the respectively illustrated ellipses). In that respect in FIG. 9 the ellipticity is at a maximum at the respective positions which are displaced in relation to the positive y-axis azimuthally through an angle of 45° or an integral multiple thereof, and continuously decreases with azimuthal approach to the x- and y-axis respectively, until a transition into linear polarisation occurs on the x- or the y-axis. In addition ellipticity increases over the pupil in the radial direction, that is to say with increasing distance from the optical axis, as the magnitude of the radial birefringence distribution also increases with the distance from the optical axis SA.

Figure 1:
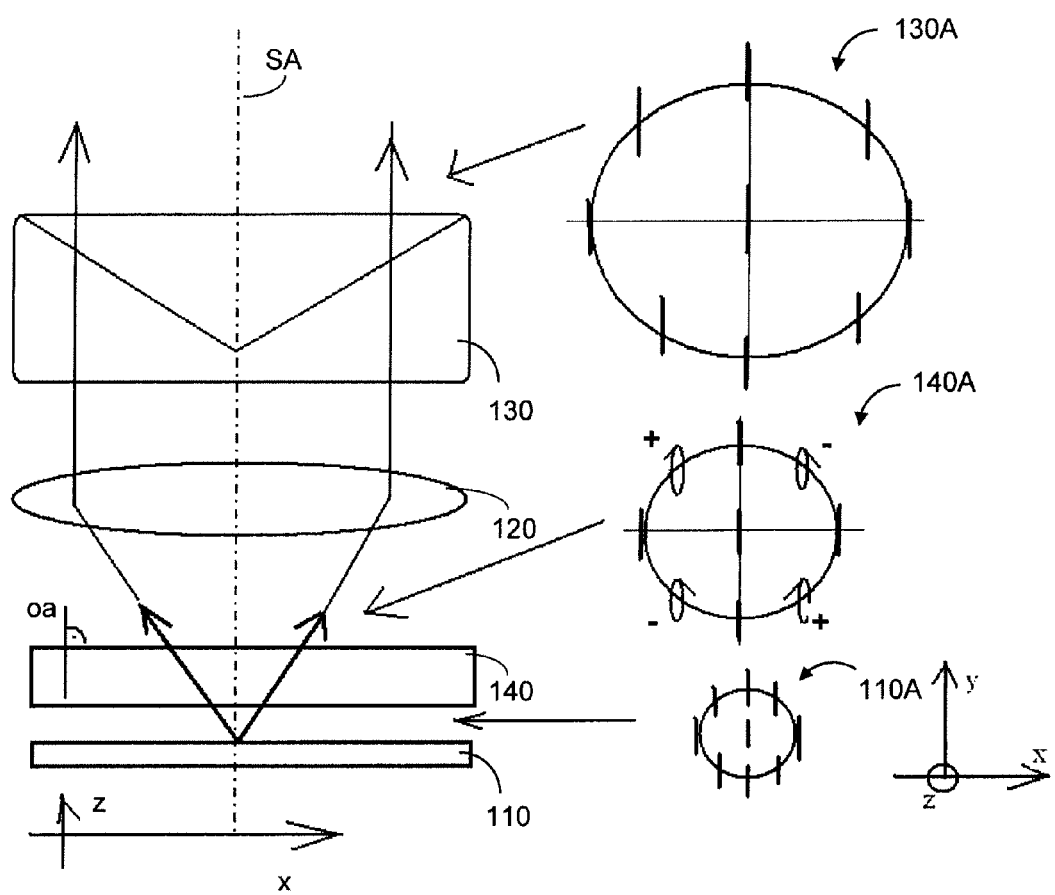
FIG. 1 shows a diagrammatic view to describe a portion of an illumination system.

FIG. 1 shows a portion for the compensation of that radial birefringence distribution, with the aim of producing light which is linearly polarised in the pupil plane instead of the above-described polarisation distribution. In this case the regions or parts which are similar to FIG. 9 are denoted by corresponding references increased by 100.

Referring to FIG. 1, arranged immediately downstream of the DOE 110 is an optical element in the form of a plane-parallel compensator plate 140. The compensator plate 140 is of a thickness which is individually matched to the illumination system and generally includes positively or negatively uniaxial birefringent crystal material (which however is not optically active). The optical crystal axis oa of the compensator plate 140 is oriented in parallel relationship with the optical system axis SA. In FIG. 1 the compensator plate 140 serves for compensation of the birefringence distribution described with reference to FIG. 9 and includes positively uniaxial crystal material in the form of magnesium fluoride ($MgF_2$). In the sense of the present application the term "positively uniaxial crystal material" is used to denote optically uniaxial crystal material in which the extraordinary refractive index $n_e$ is greater than the ordinary refractive $n_o$. In corresponding fashion the term "negatively uniaxial crystal material" is used to denote optically uniaxial crystal material in which the extraordinary refractive index $n_e$ is less than the ordinary refractive index $n_o$.

The rays of the entry beam incident on the compensator plate 140 involve an angle spectrum so that the compensator plate 140 is transited at different angles in relation to the refractive index ellipsoid of the optically uniaxial crystal material. Consequently, after the light passes through the compensator plate 140, the result is the polarisation distribution identified by reference 140*a*.

At the positions on the x- and on the y-axis respectively the linear polarisation state is still retained as here the light is in the inherent states of the birefringence distribution of the optically uniaxial crystal material of the compensator plate 140. In contrast the light is elliptically polarised on issuing from the compensator plate 140 at the other azimuth angles, more specifically being left elliptically polarised in the first and third segments (that is to say in the regions of the azimuth angle between 0° and 90° and between 180° and 270°) (identified by "−" in FIG. 1) whereas it is right elliptically polarised in the second and fourth segments (that is to say the regions of the azimuth angle between 90° and 180° and between 270° and 360°) (identified by "+" in FIG. 9). In that respect the ellipticity is at a maximum at the respective positions which are azimuthally displaced in relation to the positive y-axis by an angle of 45° or an integral multiple thereof.

As the handedness of the elliptical polarisation distribution produced (that is to say right-elliptical or left-elliptical) is opposite to that which is produced in the illumination system itself (without the compensator plate 140, that is to say in the example only by virtue of the lens 120 and the axicon 130), compensation takes place. The handedness of the elliptical polarisation distribution produced by the compensator plate (that is to say right-elliptical or left-elliptical) is dependent on the use of positively or negatively uniaxial material. Depending on the respective sign of the polarisation distribution produced by the illumination system in the segments downstream of the axicon 130 in the pupil plane, the material of the compensator plate 140 is therefore suitably selected for that purpose so that a compensation effect can be achieved. If the birefringence distribution to be compensated in the illumination system has a radial distribution in respect of the fast axis, an optically uniaxial crystal material with tangential distribution of the fast axis (for example $MgF_2$) is selected for the material of the compensator plate 140. If the birefringence distribution to be compensated in the illumination system has a tangential distribution in respect of the fast axis, an optically uniaxial crystal material with radial distribution in respect of the fast axis, for example lithium fluoride ($LiF_2$), calc-spar ($CaCO_3$) or sapphire ($Al_2O_3$) is selected for the material of the compensator plate 140.

Furthermore the material and the thickness of the compensator plate 140 are precisely so selected that the compensator plate 140 at least approximately produces the same birefringence distribution of opposite sign over the pupil. As a result therefore, as shown in FIG. 1, the rotationally symmetric birefringence effects of the compensator plate 140 on the one hand and the lens 120 and the axicon 130 on the other hand compensate each other so that once again there is a linear polarisation distribution over the pupil after the axicon 130.

It is to be noted in that respect that the strength of the birefringence acting in the compensator plate increases approximately quadratically with the maximum aperture angle of the entry beam at the location of the compensator plate 140. Consequently the thickness of the compensator plate 140 (for the same correction amount) is to be selected to be correspondingly smaller, the greater the respective maximum aperture angle of the entry beam at the location of the compensator plate 140. Optionally, the compensator plate is arranged immediately downstream of the DOE 110 or the first field plane, wherein the maximum aperture angle of the entry beam is about 25 mrad and the compensator plate is of a thickness in the range of between about 1 and 4 mm. That involves a typical compensation action (retardation) of the compensator plate depending on the respective beam angle of the order of magnitude of between about 0 and 20 nm.

Arranging the compensator plate 140 in a region of small angle divergence can be particularly advantageous for the reason that, as a consequence of the above-mentioned quadratic dependency to achieve the same compensation action via the compensator plate 140, a doubling of the aperture angle of the entry beam requires a reduction in the thickness of the compensator plate 140 by a factor of four so that, with excessively large maximum aperture angles (greater than about 35 mrad), it may no longer possible to guarantee that the compensator plate 140 can be manufactured with adequate mechanical stability or the measures which are then required (for example the use of a carrier element and implementing suitable wringing or the like) result in a considerable increase in the complication and expenditure in terms of production engineering.

In some embodiments (not shown), the DOE 110 can also be disposed directly on the underside of the compensator plate 140 so that it then serves simultaneously for producing the desired angle distribution and for compensating for the rotationally symmetric birefringence distribution which is causing trouble.

Figure 2:
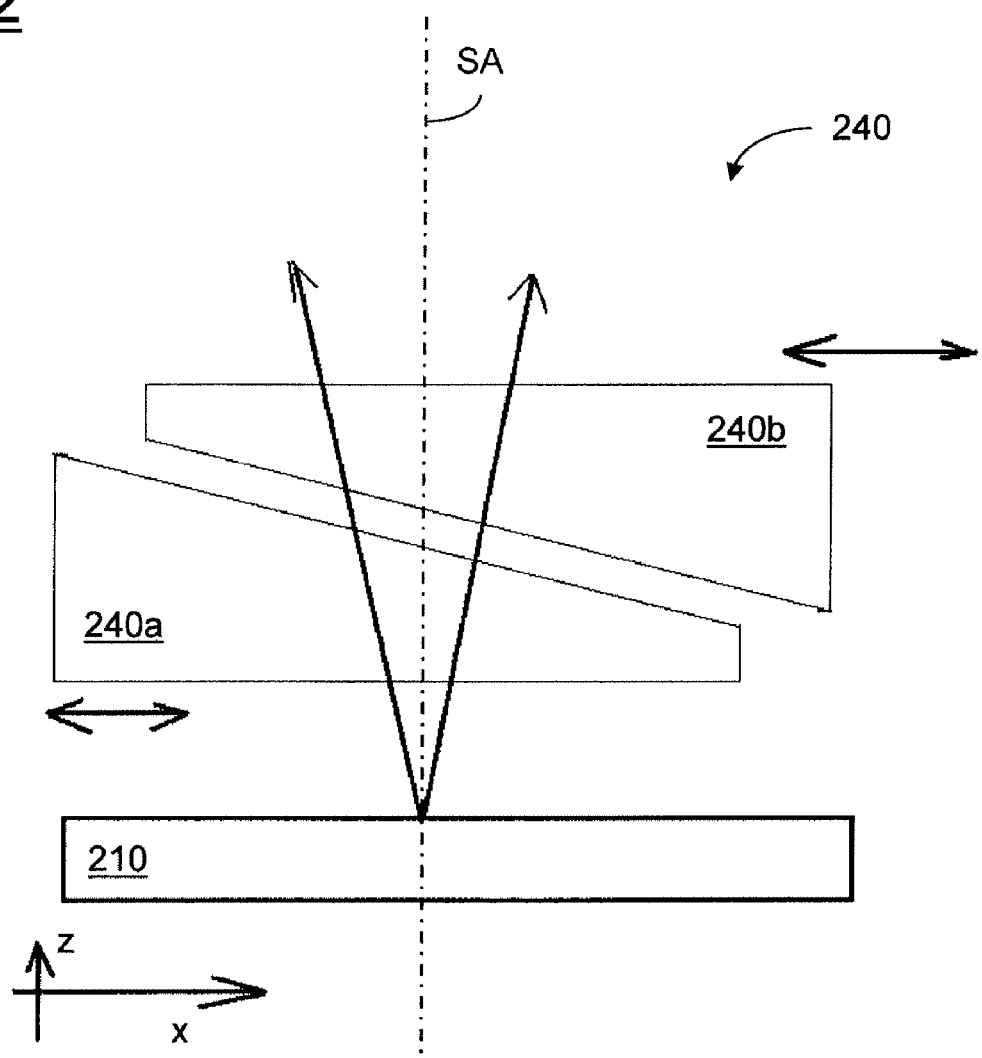
FIG. 2 shows a diagrammatic detail view to describe a portion of an illumination system.

In FIG. 2, instead of the compensator plate 140, it is also possible to use a compensator arrangement 240 including two wedges 240*a* and 240*b* which are displaceable relative to each other in a direction perpendicular to the optical axis (that is to say in the direction indicated by the double-headed arrows) so that this provides for continuous adjustability of the strength of the birefringence correction effect. The optical crystal axes of the two wedges 240*a* and 240*b* are in turn oriented in parallel relationship with the optical axis of the system or in perpendicular relationship with the plane surfaces of the wedges 240*a*, 240*b*.

In this case the two wedges 240*a* and 240*b* can be made both from the same optically uniaxial crystal material (for example also $MgF_2$) or from different materials, with a combination of positively optically uniaxial material and negatively optically uniaxial material (for example $MgF_2$ and $LiF_2$). In the latter case, displacement of the wedges and possibly additional suitable limitation of the optically effective region makes it possible to flexibly select a respective given optically effective region of the compensator arrangement 240, in which the positive or the negative optically uniaxial material dominates (depending on the desired "handedness" of the elliptical polarisation distribution produced by the arrangement) so that, depending on the respective requirements involved, it is possible to compensate for tangential or radial birefringence distribution in the illumination system.

Figure 3:
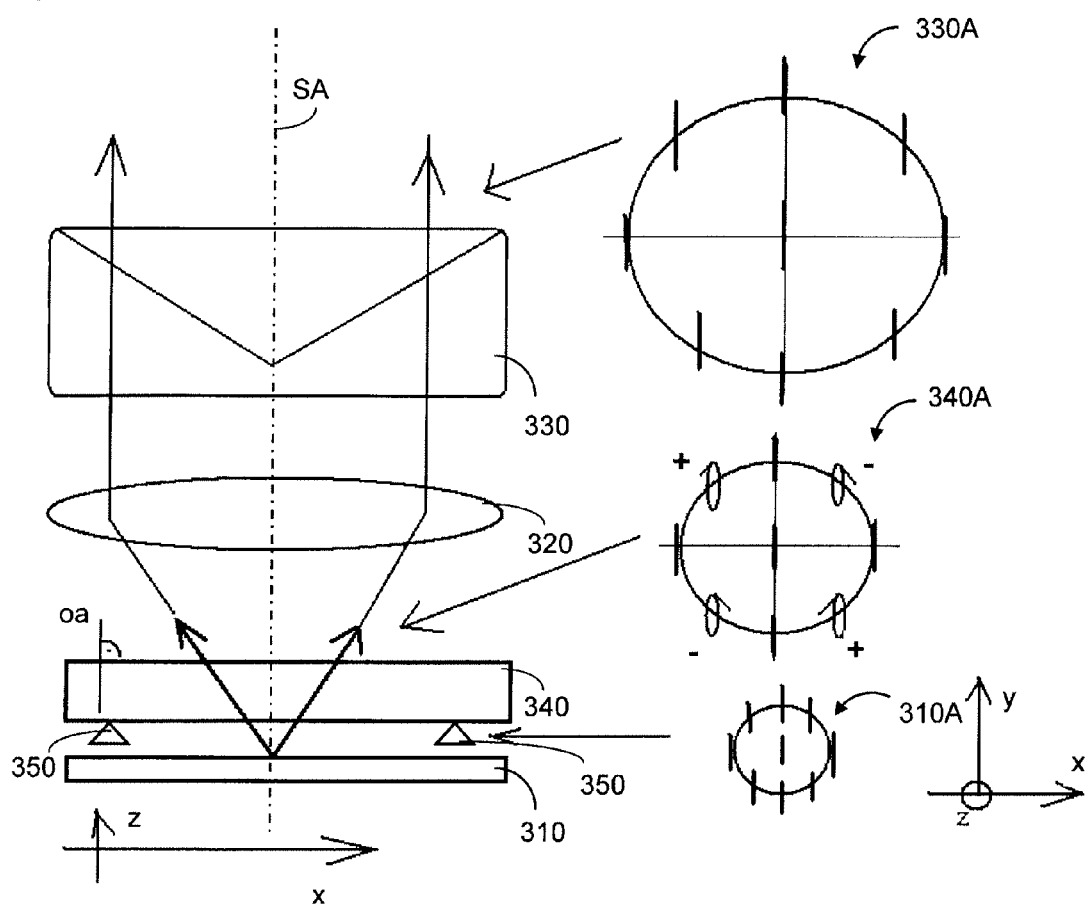
FIG. 3 shows a diagrammatic view to describe a portion of an illumination system.

In FIG. 3 the parts or regions similar to FIG. 1 are identified by corresponding references increased by 200. The arrangement shown in FIG. 3 takes account of the fact that the arrangement in the illumination system of a microlithographic projection exposure apparatus, to achieve a desired compensation effect, can involve the light passing through the optically uniaxial crystal material, in as symmetrical a relationship as possible. Now however on the one hand there are inevitable tolerances in regard to the orientation of the element of optically uniaxial crystal material. On the other hand an offset angle which is dependent on the illumination mode and which is therefore variable of about ±(2.5-3) mrad is also generally set by way of the laser beam supply unit, in order to compensate for offset angles present in the illumination system itself (for example telecentering errors).

Referring to FIG. 3, at least two manipulators 350 are now mounted in the arrangement of FIG. 1 in such a way that a predetermined tilt angle can be set between the optical crystal axis oa of the compensator plate 340 and the optical axis SA of the illumination system, more specifically for example in the range +/−10 mrad, by the compensator plate 340 being displaced locally upwardly or downwardly along the z-direction. In that respect the presetting of the tilt angle can be selected in dependence on the illumination mode and/or the direction of the laser beam with respect to the optical axis SA of the illumination system ("laser pointing").

In particular, after one-off calibration (=absolutely determining the optimum position of the optical crystal axis oa relative to the optical axis SA of the illumination system), upon a change in the laser beam direction (tilt angle of laser pointing), the tilt angle of the compensator plate 340 can be adjusted synchronously and in the same direction with the laser beam direction, that is to say the compensator plate 340 is tilted synchronously through the same angle.

Calibration for determining the optimum position of the optical crystal axis oa in relation to a fixed direction of the laser beam can be implemented as follows: firstly the illumination system is set in respect of laser pointing. Then the direction of the incoming laser beam is used as a reference direction or initial direction for adjustment of the optical crystal axis in the compensator plate 340. To establish the optimum tilt position of the compensator plate 340 with respect to that laser direction the compensator plate 340 is systematically tilted by way of the manipulators 350 and polarisation acquisition ("polarisation purity") is measured in the center of the field of the reticle with a polarimeter unit. The optimum tilt position of the compensator plate 340 is found when the polarisation loss is at its lowest. Those steps can be individually repeated for each illumination setting.

The arrangement of manipulators 350 thus permits on the one hand adjustment of the compensator plate 340, which is symmetrical in relation to the crystal structure. In addition feedback (for example dependent on the illumination setting) to beam adjustment can take place in the sense that the compensator plate 340 is suitably subsequently tilted again if the direction of the incoming laser beam is altered.

In FIGS. 4a and 4b, the regions or parts which are identical in function to FIG. 3 are denoted by corresponding references increased by 100. Referring to FIG. 4a, as in FIG. 3, a compensator plate 440 is arranged directly downstream of the DOE 410, but unlike FIG. 3 includes a negatively uniaxial crystal material, for example sapphire ($Al_2O_3$). The polarisation distribution 440A acquired in the light propagation direction downstream of the compensator plate 440 is also shown in FIG. 4a. Accordingly, when issuing from the compensator plate 440, the result is right elliptically polarised light in the first and third segments (that is to say the regions of the azimuth angle between 0° and 90° and between 180° and 270°) (identified by "+" in FIG. 4a) whereas on issuing from the compensator plate 440 the result is left elliptically polarised light in the second and fourth segments (that is to say the regions of the azimuth angle between 90° and 180° and between 270° and 360°) (identified by "−" in FIG. 4a). Referring to FIG. 4b, a lambda/2-plate 460 is now arranged immediately downstream of the compensator plate 440. The lambda/2-plate 460 also includes optically uniaxial crystal material (for example likewise sapphire), wherein the optical crystal axis oa−2 of that crystal material is oriented in the x-y-plane and along the y-axis or (as in the example of FIG. 4b) along the x-axis. As is shown in FIG. 4b via the polarisation distribution 460A achieved in the light propagation direction downstream of the lambda/2-plate 460, the lambda/2-plate 460 causes a change in sign in respect of the handedness in the elliptical polarisation distribution, that is to say on issuing from the lambda/2-plate 460 the result is now left elliptically polarised light in the first and third segments (that is to say the regions of the azimuth angle between 0° and 90° and between 180° and 270°) (identified by "−" in FIG. 4a), whereas on issuing from the lambda/2-plate 460 the result is right elliptically polarised light in the second and fourth segments (that is to say the regions of the azimuth angle between 90° and 180° and between 270° and 360°) (identified by "+" in FIG. 4a).

Generally therefore, via the arrangement shown in FIG. 4b, that is to say by virtue of the additional inclusion of a lambda/2-plate 460 downstream of the compensation plate 440, for compensating for a predetermined, rotationally symmetric birefringence distribution, it is possible to use an optically uniaxial material of opposite sign (that is to say instead of positively uniaxial material, negatively uniaxial material, or vice-versa), which is advantageous depending on the respective availability of those materials, as this means that there is no reliance on a given optically uniaxial material. In the present example a negatively uniaxial material such as sapphire can be used for example for compensating for a birefringence distribution with radial distribution of the fast axis as a consequence of using the additional lambda/2-plate 460.

Figure 6:
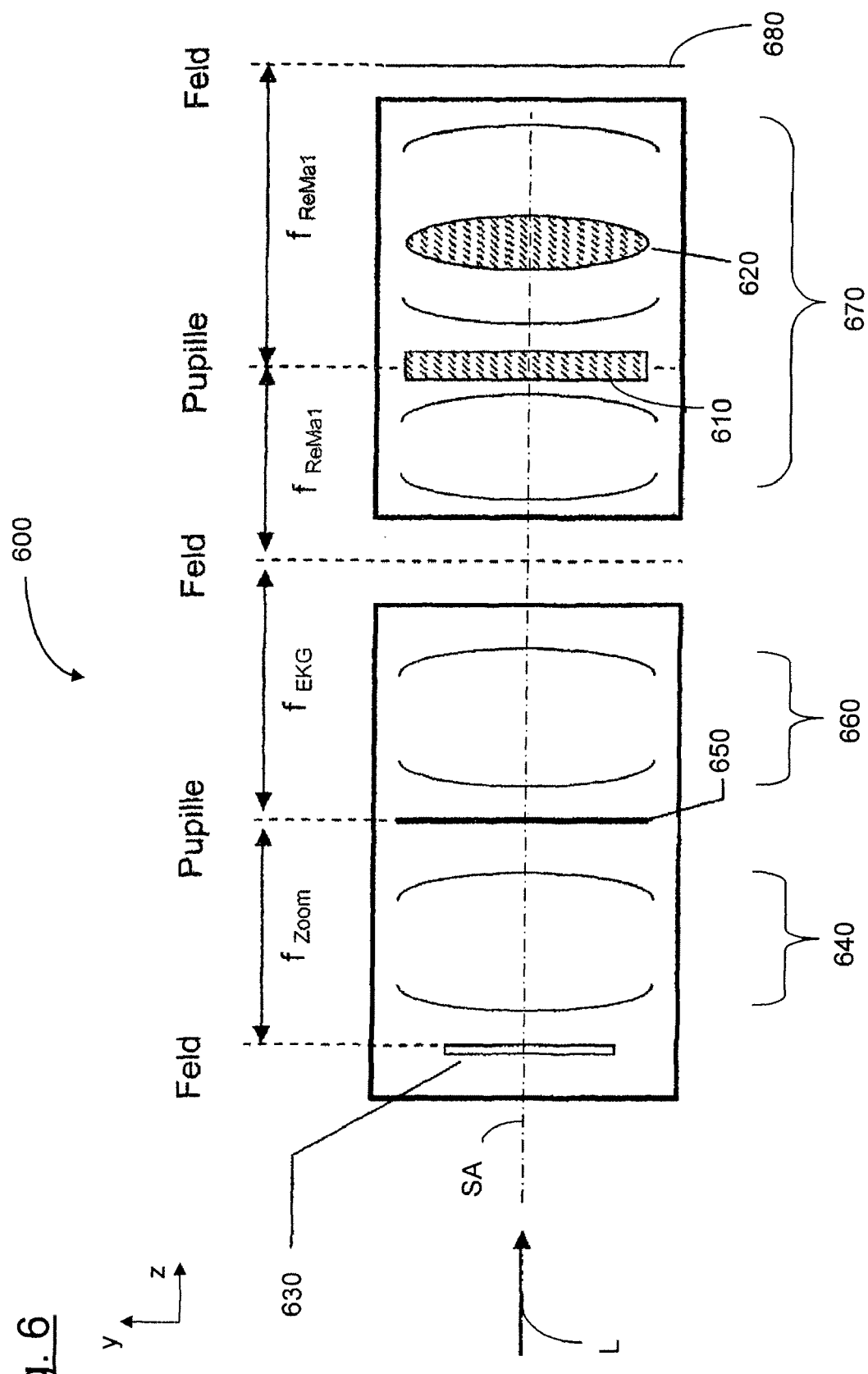
FIG. 6 shows a diagrammatic view of an illumination system with compensation of a rotationally symmetric component.

Referring to FIG. 6 an illumination system 600 uses a first optical element 610 and a second optical element 620, in each of which a respective birefringence distribution of that kind is or becomes produced, so that superpositioning of those two birefringence distributions gives rise to a desired effective birefringence distribution, by which as a result—as in the above-described embodiments—it is also possible to achieve at least partial compensation in respect of a rotationally symmetric component of a birefringence present elsewhere in the illumination system.

In that respect FIG. 6 shows a structure which substantially corresponds to the illumination system of FIG. 5 but which is illustrated in even more diagrammatic form, with a PDE (=pupil defining element) 630 arranged in the object plane of a zoom objective 640, and, arranged downstream thereof in relation to the light propagation direction L, a coupling-in group 660 which follows the first pupil plane with an FDE 650 (=field defining element) arranged therein, as well as a subsequent REMA objective 670 in which there is a second pupil plane and which projects a reticle masking system (REMA) (not shown here) on to the reticle arranged in the reticle plane 680, and thereby limits the illuminated region to the reticle.

Figure 7:
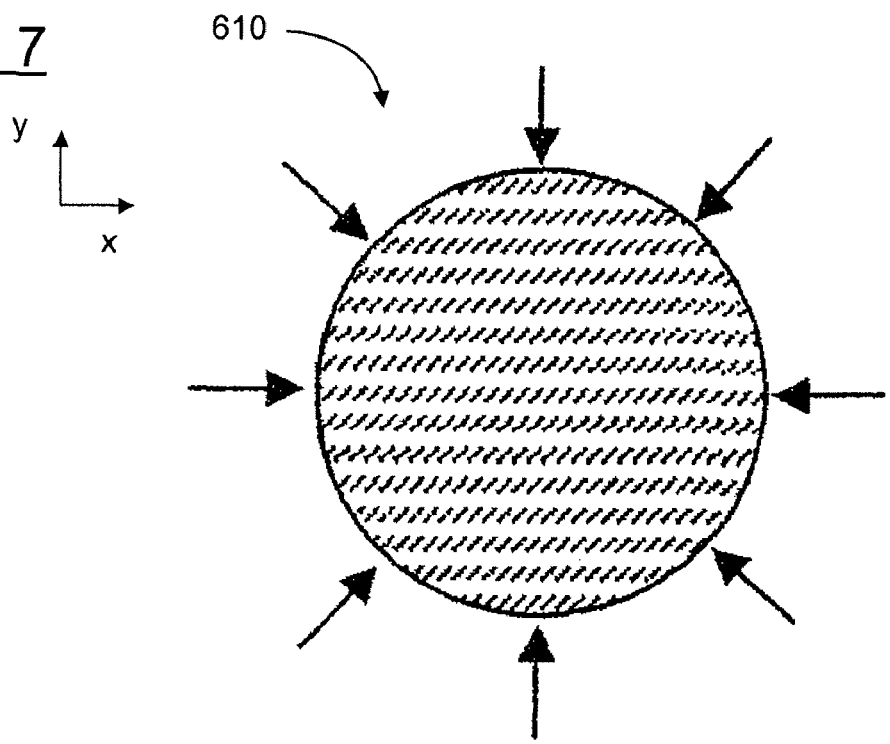
FIGS. 7 and 8 show configurations of a first optical element (FIG. 7) and a second optical element (FIG. 8) in the illumination system of FIG. 6.
Figure 8:
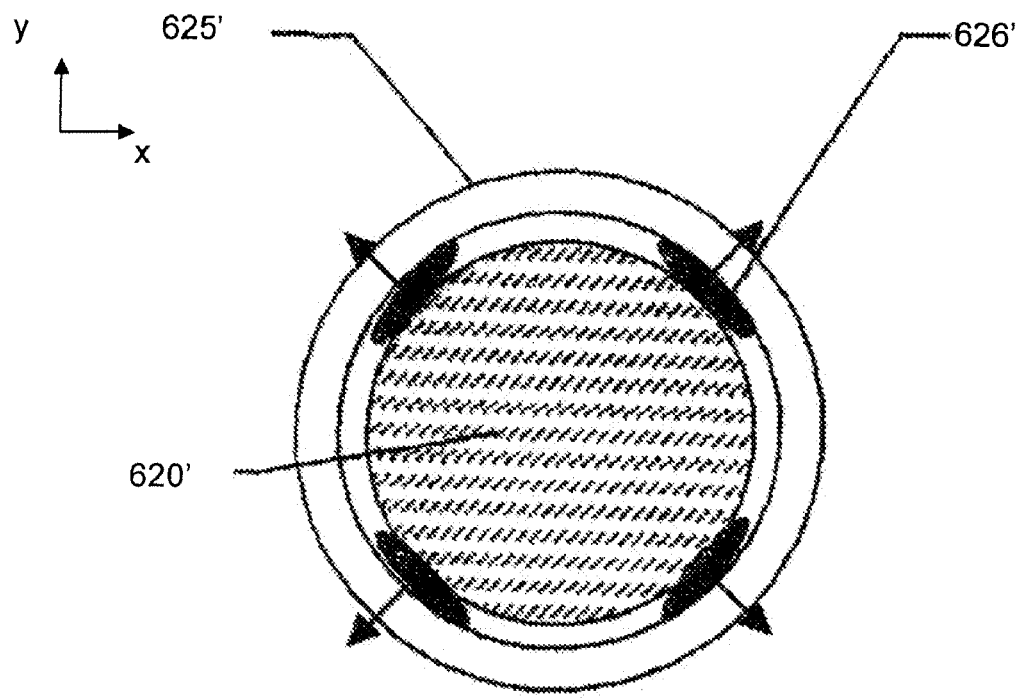

In FIGS. 6 through 8, use is made of the fact that a defined birefringence distribution can be brought about by exerting pressure or tension on an initially non-birefringent element (for example of quartz glass, $SiO_2$), or on an initially only intrinsically birefringent element (for example of calcium fluoride, $CaF_2$), as a consequence of stress birefringence.

A configuration of the first optical element 610 of circular cross-section is diagrammatically illustrated in FIG. 7, wherein for example piezoactuators exert on that optical element 610 a force which is uniformly distributed over the peripherally and which is directed radially inwardly, as is indicated by the illustrated arrows. That manner of producing a birefringence distribution can be carried out in a basically known manner and in a controlled fashion and as a result leads to a radial birefringence distribution (that is to say a radial distribution of the fast axis in respect of birefringence).

Now, that first optical element 610 is used in the illumination system 600 of FIG. 6 in the pupil plane of the REMA objective 670 (generally at least in the proximity of a pupil plane). In addition, a second optical element 620 is used, having a tangential birefringence distribution produced by stress birefringence (that is to say a tangential distribution in respect of the fast axis), which in magnitude is greater than the above-mentioned radial birefringence distribution.

The second optical element 620 can be for example an optical element in the form of a plane-parallel plate made from quartz glass ($SiO_2$) or calcium fluoride ($CaF_2$), or a lens with a tangential birefringence distribution induced by stress birefringence. In the FIG. 8 embodiment of a second optical element 620', it can also be arranged in a ring 625' (which is of adequate stiffness) in such a way that an intermediate space remaining between the second optical element 620' and the ring 625' is at least partially filled with an adhesive 626' which shrinks upon hardening and thus exerts a radially outwardly directed tensile force symbolically indicated by the illustrated arrows on the second optical element 620', the force producing the tangential birefringence distribution.

Quantitative adjustment, that is to say adjustment in respect of magnitude, of the tangential birefringence distribution produced as described hereinbefore in the second optical element 620 or 620' by way of a tensile force is basically more difficult than the radial birefringence distribution which can be produced in a more controlled fashion by the exertion of pressure in the first optical element 610. As however the tangential birefringence distribution produced in the second optical element 620 or 620' quantitatively exceeds the radial distribution produced in the first optical element 610, a tangential birefringence distribution with an adjustable "offset" is produced as a result. Consequently the birefringence distribution produced in the first optical element 610 in controlled fashion (namely by a variation in the magnitude of the radially inwardly directed force) can be used for fine adjustment of the magnitude of the effective birefringence distribution which is ultimately produced by superpositioning of the two birefringence distributions in the first and second optical elements. That has the advantage that the (basically more difficult) problem of directly producing a tangential birefringence which is quantitatively defined is circumvented in order to achieve the compensation, that is ultimately the aim, in respect of the rotationally symmetric birefringence distribution.

While certain embodiments have been described, numerous variations and alternative embodiments will be apparent to the man skilled in the art, for example by combination and/or exchange of features of individual embodiments. Accordingly it will be appreciated that such variations and alternative embodiments are also embraced by the present disclosure and the scope of the disclosure is limited only in the sense of the accompanying claims and equivalents thereof.

What is claimed is:

1. A system, comprising:
   a first optical element; and
   a second optical element,
   wherein during use of the system:
      a linearly polarised beam which has an angle spectrum comprising multiple different angles exits the second optical element and is subsequently incident on the first optical element with a maximum aperture angle of not more than 35 mrad,
      a component of a birefringence present in the system is rotationally symmetric about an optical axis of the system, and
      the rotationally symmetric component of the birefringence is at least partially compensated by the first optical element, and
   wherein:
      the second optical element is a diffractive optical element;
      the first optical element is immediately after the second optical element in a light propagation direction of the system; and
      the system is an illumination system configured to be used in a microlithographic projection exposure apparatus.

2. The system as set forth in claim 1, wherein the first optical element comprises optically uniaxial crystal material which is not optically active, and the optically uniaxial crystal material has an optical crystal axis that is parallel to optical axis of the system.

3. The system as set forth in claim 1, wherein the maximum aperture angle of the linearly polarised beam incident on the first optical element is not more than 30 mrad.

4. The system as set forth in claim 1, wherein the first optical element is immediately after a first field plane of the system in the light propagation direction of the system.

5. The system of claim 1, wherein the linearly polarised beam is a divergent light beam.

6. The system of claim 1, wherein the first optical element has a substantially plane-parallel geometry.

7. The system of claim 1, wherein the first optical element has a thickness in the range of between 0.25 mm and 5 mm.

8. The system of claim 1, wherein the first optical element comprises first and second wedge-shaped sub-elements which are displaceable relative to each other in a direction perpendicular to the optical axis of the system.

9. The system as set forth in claim 8, wherein the first wedge-shaped sub-element comprises positively uniaxial crystal material, and the second wedge-shaped sub-element comprises negatively uniaxial crystal material.

10. The system of claim 1, wherein the optically uniaxial crystal material is selected from the group consisting of magnesium fluoride ($MgF_2$), sapphire ($Al_2O_3$), lithium fluoride ($LiF_2$) and calc-spar ($CaCO_3$).

11. The system of claim 1, further comprising a lambda/2-plate immediately after the first optical element in the light propagation direction of the system.

12. The system of claim 1, further comprising a manipulator configured to set a tilt angle between the optical crystal axis and the optical axis of the system.

13. The system of claim 12, wherein the tilt angle can be regulated in dependence on an illumination mode of the system and/or a direction of light in the system.

14. An apparatus, comprising:
   an illumination system according to claim 1; and
   a projection objective,
   wherein the apparatus is a microlithographic projection exposure apparatus.

15. A process, comprising
   using a microlithographic projection apparatus to produce microstructured components, the microlithographic projection apparatus comprising:
      an illumination system according to claim 1; and
      a projection objective.

16. The process of claim 15, wherein the method comprises using the projection objective to project at least a part of a mask on to a region of a layer of photosensitive material.

17. A system, comprising:
a first optical element;
a second optical element; and
a lambda/2-plate immediately after the first optical element in a light propagation direction of the system,
wherein during use of the system:
a linearly polarised beam which has an angle spectrum comprising multiple different angles exits the second optical element and is subsequently incident on the first optical element with a maximum aperture angle of not more than 35 mrad,
a component of a birefringence present in the system is rotationally symmetric about an optical axis of the system, and
the rotationally symmetric component of the birefringence is at least partially compensated by the first optical element, and
the system is an illumination system configured to be used in a microlithographic projection exposure apparatus.

18. An apparatus, comprising:
an illumination system according to claim 17; and
a projection objective,
wherein the apparatus is a microlithographic projection exposure apparatus.

19. A process, comprising
using a microlithographic projection apparatus to produce microstructured components, the microlithographic projection apparatus comprising:
an illumination system according to claim 17; and
a projection objective.

20. The process of claim 19, wherein the method comprises using the projection objective to project at least a part of a mask on to a region of a layer of photosensitive material.

* * * * *

UNITED STATES PATENT AND TRADEMARK OFFICE
CERTIFICATE OF CORRECTION

| | | |
|---|---|---|
| PATENT NO. | : 8,081,293 B2 | Page 1 of 1 |
| APPLICATION NO. | : 12/191069 | |
| DATED | : December 20, 2011 | |
| INVENTOR(S) | : Damian Fiolka et al. | |

It is certified that error appears in the above-identified patent and that said Letters Patent is hereby corrected as shown below:

<u>Cover page item (57),</u>
Line 5, delete "polarized" and insert --polarised--

<u>Column 5,</u>
Line 13, after "a" delete "a"

Signed and Sealed this
First Day of May, 2012

David J. Kappos
*Director of the United States Patent and Trademark Office*